United States Patent
Zhou et al.

(10) Patent No.: US 11,487,912 B2
(45) Date of Patent: Nov. 1, 2022

(54) METHOD AND SYSTEM FOR 3D VISUALLY MONITORING A BUILDING, AND MEMORIZER

(71) Applicant: Carrier Corporation, Palm Beach Gardens, FL (US)

(72) Inventors: Guichun Zhou, Shanghai (CN); Danqing Sha, Shanghai (CN); Zhen Jia, Shanghai (CN); Zhengang Zhu, Shanghai (CN); Timothy C. Wagner, East Hartford, CT (US); Michael J. Birnkrant, Wethersfield, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 317 days.

(21) Appl. No.: 16/749,441

(22) Filed: Jan. 22, 2020

(65) Prior Publication Data
US 2020/0242281 A1    Jul. 30, 2020

(30) Foreign Application Priority Data

Jan. 28, 2019   (CN) .......................... 201910080979.0

(51) Int. Cl.
*G06F 30/13* (2020.01)
*G08B 17/10* (2006.01)

(52) U.S. Cl.
CPC ............. *G06F 30/13* (2020.01); *G08B 17/10* (2013.01)

(58) Field of Classification Search
None
See application file for complete search history.

(56) References Cited

U.S. PATENT DOCUMENTS

2012/0259594 A1 * 10/2012 Khan
2012/0296610 A1    11/2012 Hailemariam et al.

FOREIGN PATENT DOCUMENTS

| CN | 1087107839 A | 10/2018 |
| WO | 2010115186 A1 | 10/2010 |
| WO | 2012019022 A2 | 2/2012 |

OTHER PUBLICATIONS

European Search Report for application EP 20154199.2, dated Jul. 2, 2020, 9 pages.

* cited by examiner

*Primary Examiner* — Syed A Roni
(74) *Attorney, Agent, or Firm* — Cantor Colburn LLP

(57) ABSTRACT

A three-dimensional (3D) visual monitoring method for a building, a 3D visual monitoring system for a building, and a storage medium. The 3D visual monitoring method for a building includes acquiring a building information modeling (BIM) model and sensor data of a building, the sensor data being collected by a sensor arranged in a building area; integrating the sensor data into the BIM model; and transmitting the integrated BIM model to a display terminal, for use in a monitoring operation of the building.

11 Claims, 3 Drawing Sheets

METHOD AND SYSTEM FOR 3D VISUALLY MONITORING A BUILDING, AND MEMORIZER

FOREIGN PRIORITY

This application claims priority to Chinese Patent Application No. 201910080979.0, filed Jan. 28, 2019, and all the benefits accruing therefrom under 35 U.S.C. § 119, the contents of which in its entirety are herein incorporated by reference.

TECHNICAL FIELD

The present invention relates to the field of building monitoring technologies, and in particular, to a three-dimensional (3D) visual monitoring method for a building, a 3D visual monitoring system for a building, and a storage medium.

BACKGROUND

Various types of buildings can provide corresponding sites for production, work, and daily life of people. There are a large number of devices and persons in such buildings, and thus quite a lot of events and behaviors may be generated. Some of them may be normal and safe, but some may be abnormal or even harmful. Accordingly, it is expected to monitor events of the buildings conveniently, quickly, and reliably. Although numerous building monitoring methods have been already provided in the prior art, they still have defects and deficiencies in aspects such as visualization, intelligence, networking and convenience.

SUMMARY OF THE INVENTION

In view of the above, the present invention provides a 3D visual monitoring method for a building, a 3D visual monitoring system for a building, and a storage medium, which can solve or at least alleviate one or more of the foregoing problems in the prior art and other problems in other aspects.

Firstly, according to a first aspect of the present invention, a 3D visual monitoring method for a building is provided, comprising steps of: acquiring a BIM model and sensor data of a building, the sensor data being collected by a sensor arranged in a building area; integrating the sensor data into the BIM model; and transmitting the integrated BIM model to a display terminal, for use in a monitoring operation of the building.

In the 3D visual monitoring method for a building according to the present invention, optionally, the 3D visual monitoring method for a building further comprises a step of: parsing the acquired BIM model to integrate the sensor data into the parsed BIM model.

In the 3D visual monitoring method for a building according to the present invention, optionally, the step of parsing the acquired BIM model comprises: converting the file format of the acquired BIM model to generate an intermediate data file; and generating the parsed BIM model based on the intermediate data file; and/or the step of integrating the sensor data into the BIM model comprises: processing the acquired sensor data into data compatible with the parsed BIM model for integration into the parsed BIM model.

In the 3D visual monitoring method for a building according to the present invention, optionally, the intermediate data file is a data file in a format including a graphics language transmission format (GLTF) or graphics language binary (GLB) format, an open graphics language shading language (GLSL) format, a binary (BIN) format, and an extensible markup language (XML) format, or the intermediate data file is a data file in a format including a GLTF or GLB format, and an XML, format.

In the 3D visual monitoring method for a building according to the present invention, optionally, the step of integrating the sensor data into the BIM model comprises: processing the acquired sensor data into data compatible with the acquired BIM model for integration into the acquired BIM model.

In the 3D visual monitoring method for a building according to the present invention, optionally, the sensor data comprises real-time data and historical data collected by the sensor, and the sensor includes an imaging sensor, an acoustic sensor, a temperature sensor, a smoke sensor, a humidity sensor, an indoor air quality sensor, a gunshot sensor, a light sensor, and a presence sensor.

In the 3D visual monitoring method for a building according to the present invention, optionally, the integrated BIM model is wirelessly and/or wiredly transmitted to the display terminal, a WEB interface is applied on the display terminal for 3D visual presentation, and the display terminal includes a mobile terminal.

Moreover, according to a second aspect of the present invention, a 3D visual monitoring system for a building is also provided, comprising: an acquiring module configured to acquire a BIM model and sensor data of a building, the sensor data being collected by a sensor arranged in a building area; an integrating module connected to the acquiring module and configured to integrate the sensor data into the BIM model; and a transmitting module connected to the integrating module and configured to transmit the integrated BIM model to a display terminal, for use in a monitoring operation of the building.

In the 3D visual monitoring system for a building according to the present invention, optionally, the 3D visual monitoring system for a building further comprises: a parsing module connected to the acquiring module and the integrating module and configured to parse the acquired BIM model to integrate the sensor data into the parsed BIM model.

In the 3D visual monitoring system for a building according to the present invention, optionally, the parsing module is configured to: convert the file format of the acquired BIM model for generating an intermediate data file; and generate the parsed BIM model based on the intermediate data file; and/or the integrating module is configured to: process the acquired sensor data into data compatible with the parsed BIM model for integration into the parsed BIM model.

In the 3D visual monitoring system for a building according to the present invention, optionally, the intermediate data file is a data file in a format including a GLTF or GLB format, a GLSL format, a BIN format, and an XML format, or the intermediate data file is a data file in a format including a GLTF or GLB format, and an XML format.

In the 3D visual monitoring system for a building according to the present invention, optionally, the integrating module is configured to: process the acquired sensor data into data compatible with the BIM model for integration into the BIM model.

In the 3D visual monitoring system for a building according to the present invention, optionally, the sensor data comprises real-time data and historical data collected by the sensor, and the sensor includes an imaging sensor, an acoustic sensor, a temperature sensor, a smoke sensor, a humidity sensor, an indoor air quality sensor, a gunshot sensor, a light sensor, and a presence sensor.

In the 3D visual monitoring system for a building according to the present invention, optionally, the transmitting module is configured to wirelessly and/or wiredly transmit the integrated BIM model to the display terminal, a WEB interface is applied on the display terminal for 3D visual presentation, and the display terminal includes a mobile terminal.

In addition, according to a third aspect of the present invention, a storage medium for storing an instruction is also provided, wherein when being executed, the instruction implements the 3D visual monitoring method for a building according to any one as described above.

From the following detailed description in combination with the accompanying drawings, the principles, features, characteristics, advantages and the like of the various technical solutions according to the present invention will be clearly understood. For example, as compared with the prior art, using the technical solutions of the present invention will have obvious technical advantages. By creatively integrating Building Information Modeling (BIM) with various types of sensor data, the building structure and/or sensor information can be acquired, edited, managed, and the like in real time in a more intuitive and fast 3D visual manner. Therefore, the building can be monitored more efficiently and intelligently. Furthermore, a 3D visual operation can be carried out based on a Web interface without installing any client application, thus being very convenient and practical.

BRIEF DESCRIPTION OF THE DRAWINGS

The technical solutions of the present invention will be described in further detail in the following with reference to the accompanying drawings and embodiments. However, it should be noted that these accompanying drawings are designed merely for explanation and merely intended to conceptually illustrate structure constructions described here, and do not need to be drawn to scale.

DETAILED DESCRIPTION OF THE
EMBODIMENTS OF THE INVENTION

Firstly, it should be noted that the steps, compositions, characteristics, advantages, and the like of a 3D visual monitoring method for a building, a 3D visual monitoring system for a building, and a storage medium according to the present invention will be illustrated in the following through examples. However, all descriptions should not pose any limitation to the present invention.

Moreover, for any single technical feature described or implied in the embodiments mentioned herein, the present invention still allows for any combination or deletion of these technical features (or equivalents thereof) to obtain more other embodiments of the present invention that may not be directly mentioned herein. In addition, in order to simplify the drawings, identical or similar parts and features may be marked in only one or more places in the same drawing. Herein, the technical term "monitoring" includes operations such as presentation, information acquisition, data edition, status control, and the like, and the technical terms " . . . terminal", " . . . module" and the like include elements, apparatuses or devices that can be implemented through hardware, software, or a combination thereof.

Referring to FIG. 1 to FIG. 4, two embodiments of a 3D visual monitoring method for a building according to the present invention are provided respectively in these figures. By means of the two embodiments. The design ideas of the method according to the present invention will be described below in detail.

Figure 1:
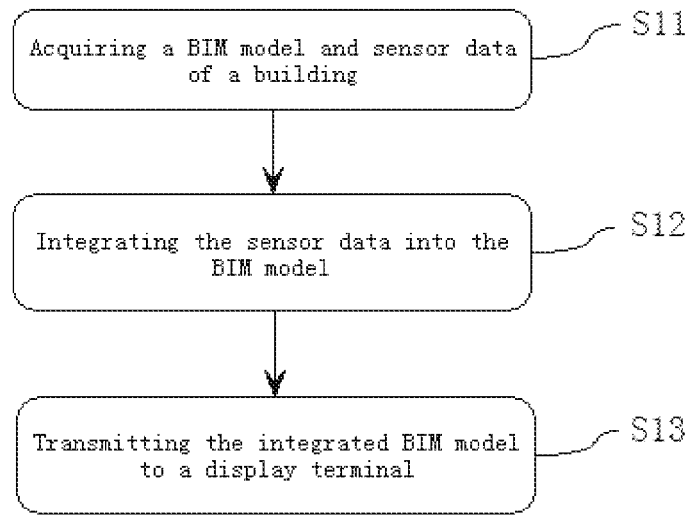
FIG. 1 is a schematic flowchart of an embodiment of a 3D visual monitoring method for a building according to the present invention.

Firstly, in the first embodiment shown in FIG. 1, the 3D visual monitoring method for a building may comprise the following steps: In step S11, a BIM model and sensor data of a building can be acquired first, so as to be integrated subsequently.

As for the BIM model, it has a 3D construction and generally may include a large amount of various types of building design information, and is allowed to be in many file formats. Without departing from the essence of the present invention, the building design information included in the BIM model and corresponding file formats can be selected and controlled according to specific application requirements, so as to the BIM model can be integrated with the sensor data very conveniently, for being transmitted to a display terminal to perform 3D visual monitoring operations for the building, such as 3D visual presentation, edition processing of building information, acquiring the sensor information, and the like.

The specific processing means for integrating the BIM model with the sensor data may be various in practical applications. For instance, in some embodiments the sensor data can be directly integrated with some data of the BIM model (or the data of the BIM model after being parsed that will be introduced in detail later) to form a data file that can be transmitted to a display terminal for use. For another instance, the sensor data can be stored in a database and then, corresponding sensor data can be obtained by accessing the database, when needed, and transmitted to the display terminal together with the data of the BIM model (or the data of the parsed BIM model).

As for the above-described sensor data, it can be collected by a sensor arranged in a building area. That is, various types of sensors can be mounted in an internal area and/or peripheral area of the building to detect and acquire information related to the building. Such type of information may be real-time data or historical data (e.g., stored in a sensor and/or a system database), and is important for helping those such as a working manager to effectively monitor the building.

In an actual application, the method of the present invention allows using any possible sensor data which may be collected and provided by various types of sensors which include, but are not limited to, an imaging sensor, an acoustic sensor, a temperature sensor, a humidity sensor, a smoke sensor, an indoor air quality sensor (IAQ Sensor), a gunshot sensor, a light sensor, and a presence sensor. Generally, the sensor data may be acquired from the server wiredly (e.g., through a USB, a gateway connection, and the like) and/or wirelessly (e.g., through BLUETOOTH, WIFI, and the like).

In addition, it should be understood that specific quantities, selected models, deployment positions, communication connection manners, and the like of such types of sensors inside and/or outside the building can be set and adjusted flexibly according to requirements in the actual applications.

Then, in step S12, the sensor data can be integrated into the acquired BIM model. As described above, the BIM model and the sensor data are all allowed to be selective. Therefore, in some applications the sensor data can be directly integrated into the BIM model, and none of them needs to undergo intermediate parsing.

Next, in step S13, the integrated BIM model can be transmitted to the display terminal (e.g., a PC, a work station, a mobile terminal, and the like) for use in a monitoring operation of the building. As such, a user can perform a building monitoring operation, such as visual presentation, editing the building information, and acquiring the sensor information, in real time in a more intuitive 3D manner.

By way of example, optionally, the user can directly use a WEB interface (such as various WEB browsers) at the display terminal to present the integrated BIM model in a 3D visual manner. For example, the BIM model can be rotated, moved, partly magnified, or the like to view detail information of floors in the building, or a sensor icon in the BIM model can be clicked to acquire a real-time state or historical data of the sensor. This will be obviously superior to a 2D-map-based method provided in the prior art. Moreover, the user does not need to install any client application in the WEB interface. Therefore, the operation is rather convenient and very practical.

Figure 2:
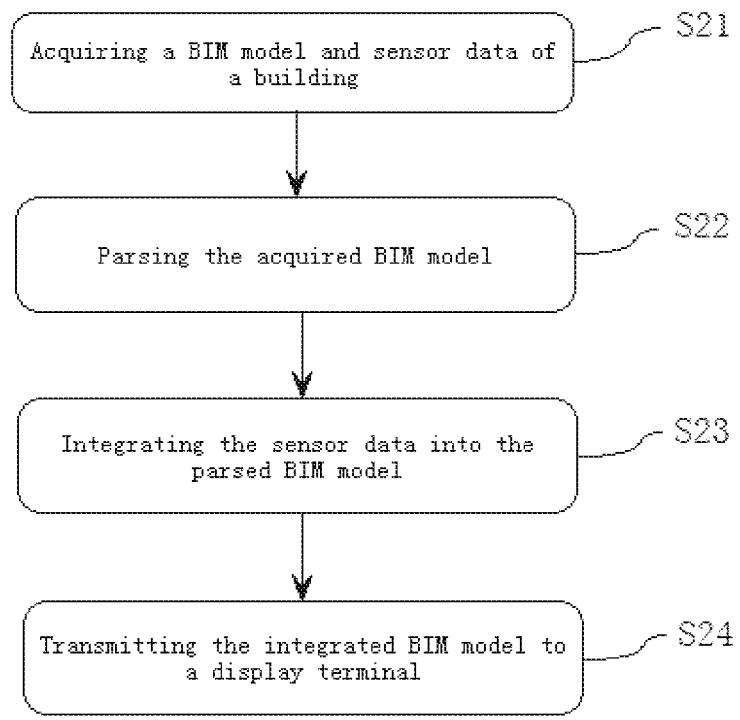
FIG. 2 is a schematic flowchart of another embodiment of a 3D visual monitoring method for a building according to the present invention.

Still referring to FIG. 2, a second embodiment of a 3D visual monitoring method for a building according to the present invention is shown. Unless otherwise specified, the descriptions and explanations about the contents of identical or corresponding step and feature, etc. related to the first embodiment will be applicable to the second embodiment.

The 3D visual monitoring method for a building may comprise the following steps: In step S21, a BIM model and sensor data of a building can be acquired first; Then, in step S22, the acquired BIM model is parsed so that the sensor data can be integrated into the parsed BIM model subsequently. Although in the embodiment shown in FIG. 1 the sensor data is allowed to be directly integrated into the BIM model in some applications, in some other applications the BIM model needs to be parsed first, and then the sensor data can be integrated into the parsed BIM model. For example, a file format of the BIM model can be converted to generate an intermediate data file, and then a desired parsed BIM model for integration can be generated based on the intermediate data file.

By way of example, most existing BIM models adopt an IFC file format, and files thereof are generally large and unsuitable for WEB transmission, presentation, and edition, and the like. Therefore, by taking a BIM model using the international foundation class (IFC) file format as an example in the following, two specific examples for parsing the BIM model are provided respectively in FIG. 2 and FIG. 3.

Firstly, in the example shown in FIG. 2, a parsing tool P1 (such as IFCConvert, etc.) can be used to convert the BIM model in an IFC format into intermediate data files in a digital asset exchanger (DAE) format and an XML format, a parsing tool P2 (such as Collada2GLTF, etc.) can be used to convert the above files in the DAE format into intermediate data files in a GLTF or GLB format, a GLSL format, and a BIN format, and then a parsing tool P3 (such as BIMSurfer, etc.) can be used to convert the foregoing intermediate data files into the desired parsed BIM model for integration. The BIM model can only include the required data information such as the building structure information, etc., which can avoid using the formerly larger BIM model.

Figure 3:
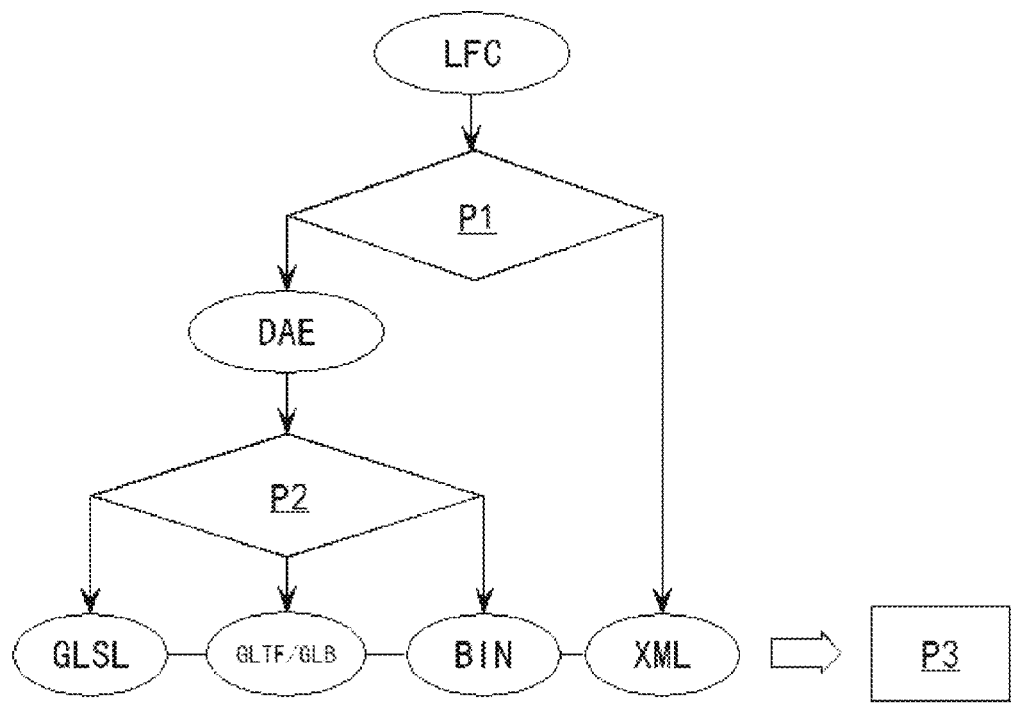
FIG. 3 is an exemplary diagram for parsing a BIM model in the embodiment shown in FIG. 2.
Figure 4:
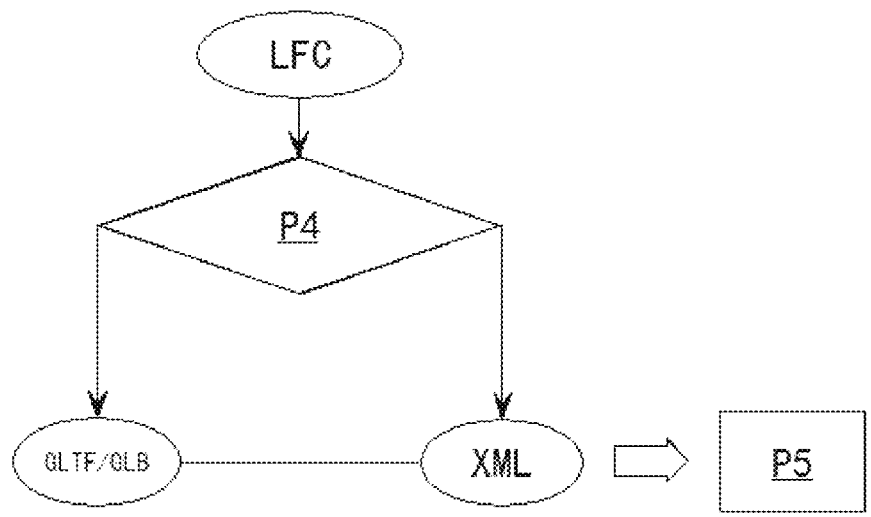
FIG. 4 is another exemplary diagram for parsing a BIM model in the embodiment shown in FIG. 2.

Next, in the example shown in FIG. 3, a parsing tool P4 (such as IFCConvert, etc.) can be used to extract intermediate data files in a GLTF or GLB format and an XML format from a BIM model in an IFC format, and then import the intermediate data files into a parsing tool P5 (such as a BIM visual tool, etc.) to generate the desired parsed BIM model for integration. The BIM model can only include the required data information such as the building structure information etc., which can avoid using the formerly larger BIM model.

It should be understood that the two examples are merely exemplary illustrations. In the method of the present invention, any possible parsing tool, parsing method, and the like can be allowed to parse the acquired BIM model to obtain the desired BIM model that can be integrated with the sensor data.

Then, in step S23, the sensor data can be integrated into the BIM model. In the method of the present invention. The sensor data is allowed to be directly integrated into the BIM model. However, the present invention allows that, in some applications, the acquired sensor data can be first processed into data compatible with the parsed BIM model before being integrated into the BIM model.

For example, the sensor data compatible with the BIM model can be obtained by connecting to an API of the sensor or by connecting to a building monitoring system (such as DIP, OnGuard, WebCTRL, etc.) to which the sensor is mounted, so as to be integrated with the BIM model.

For another example, the sensor data compatible with the BIM model can be obtained from the sensor based on some modules, units, or apparatuses (such as a "UTC Sensor Assistant" installed to a Raspberry PI), so as to be integrated with the BIM model.

It should be noted that optionally, the foregoing method of first processing the acquired sensor data into data compatible with the parsed BIM model before being integrated into the BIM model can also be applied to step S12 in the embodiment shown in FIG. 1, thus forming more feasible implementation manners of the 3D visual monitoring method for a building according to the present invention.

Figure 5:
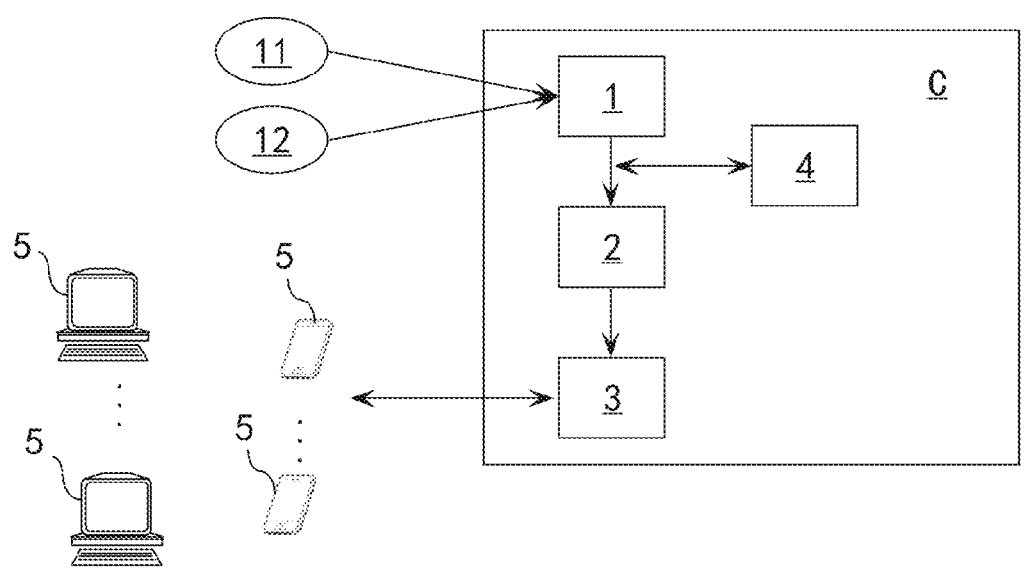
FIG. 5 is a schematic constitutional diagram of an embodiment of a 3D visual monitoring system for a building according to the present invention, in which the examples of a BIM model, sensor data, and a display terminal are all shown schematically.

In order to better understand the technical solutions of the present invention, general composition of an embodiment of a 3D visual monitoring system for a building according to the present invention is also schematically shown in FIG. 5.

For example, in this embodiment the system may comprise an acquiring module 1, an integrating module 2, a transmitting module 3, and a parsing module 4. During a specific application, a processor C can be used to implement functions of the foregoing modules. That is, the functions can be implemented via the processor C by executing an instruction stored in a storage medium.

In this embodiment, as shown in FIG. 5, the acquiring module 1 is configured to acquire a BIM model 11 and sensor data 12 of a building. The sensor data 12 may be collected by a sensor deployed in a building area, and it may be real-time data or historical data.

As for the integrating module 2, it is connected to the acquiring module 1 and configured to integrate the sensor data 12 into the BIM model.

As for the transmitting module 3, it is connected to the integrating module 2 and configured to transmit the integrated BIM model 11 to a display terminal 5 (such as a PC, a work station, and a mobile terminal, etc.), for monitoring the building in a 3D visual manner.

As for the parsing module 4, it is connected to the acquiring module 1 and the integrating module 2 and configured to parse the acquired BIM model 11 to integrate the sensor data 12 into the parsed BIM model. It should be noted that in some specific application embodiments, the parsing module 4 needs not to be provided, that is, the integrating module 2 may be used to directly integrate the sensor data 12 into the obtained BIM model 11.

Moreover, optionally, the parsing module 4 may be configured to: convert the file format of the acquired BIM model 11 to generate an intermediate data file, and generate the parsed BIM model based on the intermediate data file, for being integrated with the sensor data 12.

In addition, optionally, the integrating module 2 may be configured to: process the sensor data 12 into data compatible with the acquired BIM model 11, so as to be integrated into the BIM model 11; or process the sensor data 12 into data compatible with the parsed BIM model, so as to be integrated into the parsed BIM model.

It can be understood that technical contents such as the BIM model, the sensor, the sensor data, the intermediate data files, parsing of the BIM model, integration of the sensor data with the BIM model, the display terminal, and the like have been already described in details when the 3D visual monitoring method for a building according to the present invention is introduced by way of examples in the foregoing with reference to FIG. 1 to FIG. 4. Thereby, reference can be made directly to the specific descriptions of the corresponding parts in the foregoing, and these will not be repeated in the descriptions of the 3D visual monitoring system for a building according to the present invention.

In addition, a storage medium for storing an instruction is further provided according to another technical solution of the present invention. When being executed by, for example, an execution component, module or apparatus such as a processor, the instruction is used to implement the 3D visual monitoring method for a building according to the present invention described through the examples with reference to FIG. 1 to FIG. 4, thus achieving the aforementioned advantages of the solutions of the present invention that are obviously superior to the prior art.

The 3D visual monitoring method for a building, the 3D visual monitoring system for a building and the storage medium according to the present invention are explained in detail above by way of example only. These examples are only used to explain the principle of the present invention and embodiments thereof, and are not intended to limit the present invention. Those skilled in the art may also make various modifications and improvements without departing from the spirit and scope of the present invention. Therefore, all equivalent technical solutions shall fall within the scope of the present invention and be defined by the claims of the present invention.

What is claimed is:

1. A three dimensional (3D) visual monitoring method for a building, the method comprising:
   acquiring a building information modeling (BIM) model and sensor data of a building, the sensor data being collected by a sensor arranged in a building area;
   parsing the acquired BIM model, wherein the parsing the acquired BIM model comprises converting a file format of the acquired BIM model to generate an intermediate data file and generating a parsed BIM model based on the intermediate data file;
   integrating the sensor data into the parsed BIM model to define an integrated BIM model; and
   transmitting the integrated BIM model to a display terminal, for use in a monitoring operation of the building.

2. The 3D visual monitoring method for a building according to claim 1, wherein the
   integrating the sensor data into the parsed BIM model comprises:
   processing the acquired sensor data into data compatible with the parsed BIM model for integration into the parsed BIM model.

3. The 3D visual monitoring method for a building according to claim 2, wherein the intermediate data file is a data file in a format including a graphics language transmission format (GLTF) or graphics language binary (GLB) format, an open graphics language shading language (GLSL) format, a binary (BIN) format, and an extensible markup language (XML) format, or the intermediate data file is a data file in a format including a GLTF or GLB format, and an XML, format.

4. The 3D visual monitoring method for a building according to claim 1, wherein the sensor data comprises real-time data and historical data collected by the sensor, and the sensor includes an imaging sensor, an acoustic sensor, a temperature sensor, a smoke sensor, a humidity sensor, an indoor air quality sensor, a gunshot sensor, a light sensor, and a presence sensor.

5. The 3D visual monitoring method for a building according to claim 1, wherein the integrated BIM model is wirelessly and/or wiredly transmitted to the display terminal, a WEB interface is applied on the display terminal for 3D visual presentation, and the display terminal includes a mobile terminal.

6. A non-transitory storage medium for storing an instruction, wherein when being executed, the instruction implements the 3D visual monitoring method for a building according to claim 1.

7. A three dimensional (3D) visual monitoring system for a building, comprising:
   an acquiring module configured to acquire a building information modeling (BIM) model and sensor data of a building, the sensor data being collected by a sensor arranged in a building area;
   a parsing module connected to the acquiring module and an integrating module and configured to parse the acquired BIM model, wherein the parsing the acquired BIM model comprises converting a file format of the acquired BIM model to generate an intermediate data file and generating a parsed BIM model based on the intermediate data file;
   an integrating module connected to the acquiring module and configured to integrate the sensor data into the parsed BIM model to define an integrated BIM model; and
   a transmitting module connected to the integrating module and configured to transmit the integrated BIM model to a display terminal, for use in a monitoring operation of the building.

8. The 3D visual monitoring system for a building according to claim 7, wherein
   the integrating module is configured to:
   process the acquired sensor data into data compatible with the parsed BIM model for integration into the parsed BIM model.

9. The 3D visual monitoring system for a building according to claim 8, wherein the intermediate data file is a data file in a format including a graphics language transmission format (GLTF) or graphics language binary (GLB) format, an open graphics language shading language (GLSL) format, a binary (BIN) format, and an extensible markup language (XML) format, or the intermediate data file is a data file in a format including a GLTF or GLB format, and an XML format.

10. The 3D visual monitoring system for a building according to claim 7, wherein the sensor data comprises real-time data and historical data collected by the sensor, and the sensor includes an imaging sensor, an acoustic sensor, a temperature sensor, a smoke sensor, a humidity sensor, an indoor air quality sensor, a gunshot sensor, a light sensor, and a presence sensor.

11. The 3D visual monitoring system for a building according to claim 7, wherein the transmitting module is configured to wirelessly and/or wiredly transmit the integrated BIM model to the display terminal, a WEB interface is applied on the display terminal for 3D visual presentation, and the display terminal includes a mobile terminal.

\* \* \* \* \*